(12) United States Patent
Chen et al.

(10) Patent No.: US 8,935,594 B2
(45) Date of Patent: Jan. 13, 2015

(54) STRUCTURE OF ECC SPARE BITS IN 3D MEMORY

(75) Inventors: Shih-Hung Chen, Jhudong Township, Hsinchu County (TW); Hang-Ting Lue, Hsinchu (TW); I-Jen Huang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 517 days.

(21) Appl. No.: 13/052,762

(22) Filed: Mar. 21, 2011

(65) Prior Publication Data

US 2012/0185753 A1  Jul. 19, 2012

Related U.S. Application Data

(60) Provisional application No. 61/433,763, filed on Jan. 18, 2011.

(51) Int. Cl.
| | |
|---|---|
| *G11C 29/00* | (2006.01) |
| *H01L 27/06* | (2006.01) |
| *G06F 11/10* | (2006.01) |
| *H01L 27/115* | (2006.01) |

(52) U.S. Cl.
CPC ........ *H01L 27/0688* (2013.01); *G06F 11/1044* (2013.01); *G06F 11/1072* (2013.01); *G06F 11/1076* (2013.01); *G06F 11/1068* (2013.01); *G06F 11/1048* (2013.01); *H01L 27/11573* (2013.01); *H01L 27/11578* (2013.01)
USPC .......................................... 714/773; 714/766

(58) Field of Classification Search
CPC ............ G06F 11/1076; G06F 11/1068; G06F 11/1044; G06F 11/1072
USPC ..................................................... 714/773, 766
See application file for complete search history.

(56) References Cited

U.S. PATENT DOCUMENTS

| | | | |
|---|---|---|---|
| 5,915,167 A * | 6/1999 | Leedy | 438/108 |
| 6,208,545 B1 | 3/2001 | Leedy | |
| 6,407,953 B1 * | 6/2002 | Cleeves | 365/201 |

(Continued)

FOREIGN PATENT DOCUMENTS

| | | |
|---|---|---|
| CN | 1268925 A | 10/2000 |
| CN | 101627371 A | 1/2010 |
| WO | 2010117914 A1 | 10/2010 |

OTHER PUBLICATIONS

CN Office Action dated Jan. 27, 2014.

*Primary Examiner* — Joseph D Torres
(74) *Attorney, Agent, or Firm* — McClure, Qualey & Rodack, LLP

(57) ABSTRACT

A structure of 3D memory comprises a plurality of stacking layers and a plurality of cells. The stacking layers are arranged in a three-dimensional array and disposed parallel to each other on a substrate, and the stacking layers comprises a plurality of stacking memory layers. The cells comprises a first group of cells (such as m of cells) for storing information data and a second group of cells (such as n of cells) for storing ECC (error checking and correcting) spare bits. All of the first group and the second group of cells are read out at the same time for performing an ECC function. The ECC spare bits in the 3D memory according to the present disclosure can be constructed at the same physical layer or at the different physical layers. The embodiments can be implemented, but not limited, by a vertical-gate (VG) structure or a finger VG structure.

15 Claims, 8 Drawing Sheets

(56) References Cited

U.S. PATENT DOCUMENTS

| | | | |
|---|---|---|---|
| 6,515,923 B1* | 2/2003 | Cleeves | 365/201 |
| 6,851,082 B1* | 2/2005 | Corbett | 714/770 |
| 6,973,604 B2* | 12/2005 | Davis et al. | 714/710 |
| 7,076,722 B2* | 7/2006 | Shibata | 714/763 |
| 7,330,370 B2* | 2/2008 | Rinerson et al. | 365/158 |
| 7,558,096 B2* | 7/2009 | Ikeda | 365/51 |
| 7,760,547 B2* | 7/2010 | Lutze et al. | 365/185.05 |
| 7,763,496 B2* | 7/2010 | Ikeda et al. | 438/109 |
| 8,136,017 B2* | 3/2012 | Oh et al. | 714/773 |
| 8,458,564 B2 | 6/2013 | Murray et al. | |
| 2006/0028864 A1* | 2/2006 | Rinerson et al. | 365/158 |
| 2007/0117317 A1* | 5/2007 | Ikeda et al. | 438/257 |
| 2007/0194455 A1* | 8/2007 | Ikeda et al. | 257/777 |
| 2008/0101104 A1* | 5/2008 | Ikeda | 365/51 |
| 2008/0212352 A1* | 9/2008 | Oh et al. | 365/51 |
| 2009/0296476 A1* | 12/2009 | Shin et al. | 365/185.17 |
| 2010/0162065 A1* | 6/2010 | Norman | 714/746 |
| 2010/0270593 A1* | 10/2010 | Lung et al. | 257/208 |
| 2010/0281341 A1* | 11/2010 | Wu et al. | 714/763 |
| 2011/0210301 A1* | 9/2011 | Nansei | 257/2 |

* cited by examiner

STRUCTURE OF ECC SPARE BITS IN 3D MEMORY

This application claims the benefit of U.S. Provisional Application No. 61/433,763, filed Jan. 18, 2011, the subject matter of which is incorporated herein by reference.

BACKGROUND

1. Field of the Invention

The disclosure relates in general to a three-dimensional (3D) memory structure, and more particularly to a structure of ECC spare bits in 3D memory.

2. Description of the Related Art

In those years, the configurations of semiconductor devices have been refined, and the capacity of semiconductor memories has been increased. Particularly, manufactures have been looking for the developments or techniques combination for stacking multiple planes of memory cells, so as to achieve greater storage capacity. For example, several types of multi-layer stackable thin-film transistor (TFT) NAND-type flash memory structures have been proposed. Thus, the size of the semiconductor device with large capacity is reduced due to the stacked three-dimensional (3D) memory structure.

The development of semiconductor devices has generally followed Moore's, and the device size has been reduced to half every 1~2 years in these years. However, the accepted defect size shrinks to half at the same time. This results in the difficulty during production. For non-violate memory (NVM), moreover, multi-level or even triple-level cell design further reduces the process/product window.

ECC (Error Checking and correcting) and repair function are the most promising solution. However, they are not free. Extra ECC bits are necessary to store the information for data correction. For performing the ECC and repair function, the more error bits to be corrected, the more spare area has to be reserved for ECC bits. Typical two-dimensional semiconductor structure need extra area for ECC and repair function. For example, to perform ECC/repair function in a 1 KB page size with the BCH model for a 2D semiconductor structure, about 4%~4.2% extra area for spare bits are required to correct the error up to 24 bits. As to 2xnm node MLC NAND structure, 64-bit ECC is need, and the forecasted spare area for performing 64-bit ECC will be 11.2%, which is roughly the same as cost increase of 11.2%. Thus, the more error bits to be corrected, the more spare area of ECC bits to be reserved and the more expansive of the product.

Regarding to SSD (solid state drive), some analyses comment that over 100-bit ECC would be needed, equivalent to 17.5% penalty in area (17.5% of extra cost), to guarantee the better reliability of device.

FIG. 1 depicts a typical three-dimensional (3D) memory with ECC spare. The 3D memory structure 1 of FIG. 1 has 4 planes/stacking memory layers 101-104 on the substrate 10, wherein the ECC spare portion 12 in every stacking memory layer contains ECC bits for correcting/repairing the information data stored in the portion 11. The typical three-dimensional (3D) memory structure have the same issue as the two-dimensional (2D) memory structure, extra area in each plane (4 planes/stacking memory layers shown in FIG. 1) is need for ECC/repair. For 3D memory, more spare area for performing ECC/repair function is required supposedly for the concern of uniformity of TFT devices.

Generally, it is easier to design a 3D memory with $2^N$ stacking memory layers with ECC/repair spare bits, (for example, 4 planes/stacking memory layers 101~104 on the substrate 10 as shown in FIG. 1 are increased to 8 planes/stacking memory layers) since cost drop to half while a number of the stacking memory layers are doubled. Although it is possible to design a 3D memory with non-$2^N$ stacking memory layers with ECC/repair spare bits, it may need some extra effort on the structural design and may increase cost on periphery manufacture. FIG. 2 depicts another typical three-dimensional (3D) memory with ECC spare. The 3D memory 1 of FIG. 1 has 4 stacking memory layers (i.e. $2^N$ stacking memory layers), and the 3D memory 2 of FIG. 2 has 6 stacking memory layers 101~106 (i.e. non-$2^N$ stacking memory layers). It is estimated that the complex design of 3D memory of FIG. 2 would increase the periphery manufacturing cost of about 10% although the array manufacturing cost drop is about 33%.

Besides the manufacturing techniques (such as etching defects) and the reliability of TFT performance to be improved, it is also desirable to develop a three-dimensional flash memory structure with larger number of multiple planes being stacked to achieve greater storage capacity using an improved way of ECC correction without increasing the manufacturing cost, even decreasing the cost.

SUMMARY

The disclosure relates to a structure of ECC spare bits in 3D memory. With spare bits for performing ECC and/or repair function constructed by the embodiments of the disclosure, the storage capacity of ECC spare bits and the reliability of 3D memory structure can be improved without increasing the cost.

According to an embodiment of the present disclosure, a structure of three-dimensional (3D) memory comprises a plurality of stacking layers and a plurality of cells. The stacking layers are arranged in a three-dimensional array and disposed parallel to each other on a substrate, and the stacking layers comprises a plurality of stacking memory layers. The cells comprises a first group of cells for storing information data and a second group of cells for storing ECC (error checking and correcting) spare bits, and the first group of cells are positioned at the stacking memory layers. All of the first group and the second group of cells are read out at the same time for performing an ECC function.

According to an embodiment of the present disclosure, a structure of 3D memory comprises a substrate, a plurality of horizontal layers with plural sets of bit lines, a plurality of word lines, m of cells for storing information data and n of cells for storing ECC spare bits. The horizontal layers are arranged in a three-dimensional array and disposed in parallel to the substrate. The sets of bit lines in each horizontal layer are disposed in parallel to each other. The word lines are disposed vertically to the substrate and vertically to the sets of bit lines. Also, m of cells for storing information data and n of cells for storing ECC spare bits are read out at the same time for performing the ECC and repair function in the embodiment of the disclosure.

In one embodiment, the ECC spare bits in the 3D memory according to the present disclosure are constructed at one or more extra layers (i.e. in the same physical layer/plane). In another embodiment, the ECC spare bits in the 3D memory according to the present disclosure are constructed at the different physical layers.

The disclosure will become apparent from the following detailed description of the preferred but non-limiting embodiments. The following description is made with reference to the accompanying drawings.

DETAILED DESCRIPTION

Figure 1:
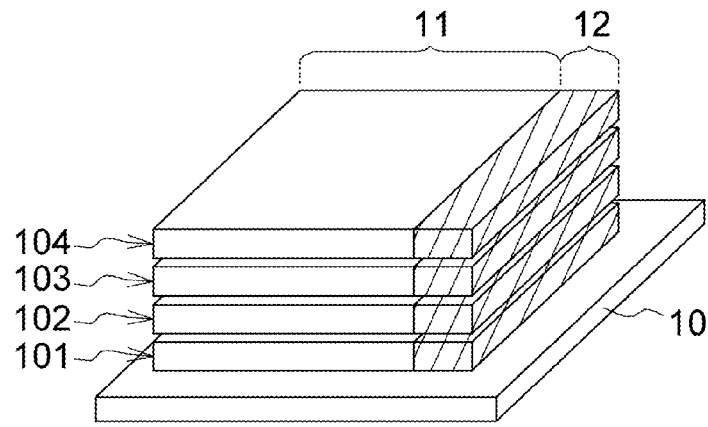
FIG. 1 (Prior Art) depicts a typical three-dimensional (3D) memory with ECC spare.
Figure 2:
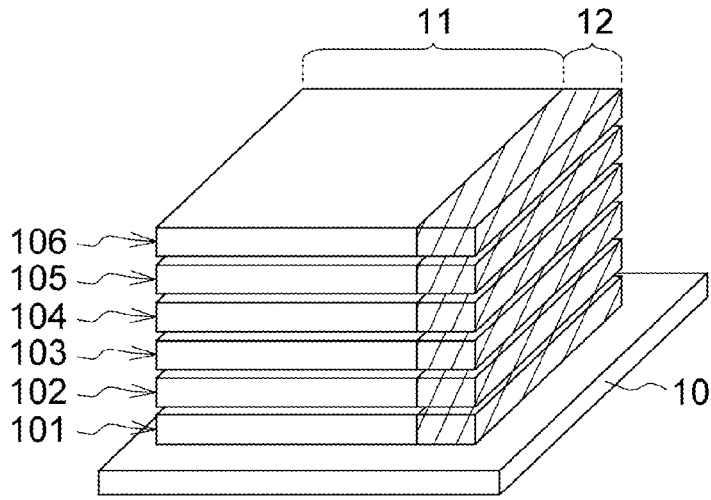
FIG. 2 (Prior Art) depicts another typical three-dimensional (3D) memory with ECC spare.

In the embodiments of the present disclosure, a structure of ECC spare bits in 3D memory comprising a plurality of stacking layers and a plurality of cells is provided. The stacking layers are arranged in a three-dimensional array and disposed parallel to each other on a substrate, and the stacking layers comprises a plurality of stacking memory layers. The cells comprises a first group of cells for storing information data and a second group of cells for storing ECC (error checking and correcting) spare bits, and the first group of cells are positioned at the stacking memory layers. All of the first group and the second group of cells are able to be read out at the same time for performing an ECC and repair function. For example, the three-dimensional (3D) memory according to an embodiment of the present disclosure has m of cells for storing information data and n of cells for storing ECC spare bits, wherein n and m are positive integers, and n<m. Also, (m+n) of cells can be read out at the same time for performing the ECC and repair function.

The embodiments of the present disclosure can be implemented, but not limited, by a vertical-gate (VG) structure or a finger VG structure. Also, the ECC spare bits in the 3D memory according to the present disclosure can be constructed at one or more extra layers (i.e. in the same physical layer/plane), or can be constructed at the different physical layers, which are further described in the first and second embodiments of the disclosure, respectively.

Also, common reference numerals are used throughput the drawings and the detailed description to indicate the same elements. Also, the illustrations are not necessarily being drawn to scale. There may be distinctions between the artistic renditions in the present disclosure and the actual apparatus due to manufacturing processes and tolerances. The descriptions disclosed in those embodiments of the disclosure are for illustration not for limiting the scope of protection of the disclosure. Modifications may be made to adapt a particular situation, material, composition of matter, method, or process to the objective, spirit and scope of the invention.

First Embodiment

In the first embodiment, the ECC spare bits are constructed in the same physical layer/plane, for example, at one or more extra layers, in the 3D memory.

Figure 3:
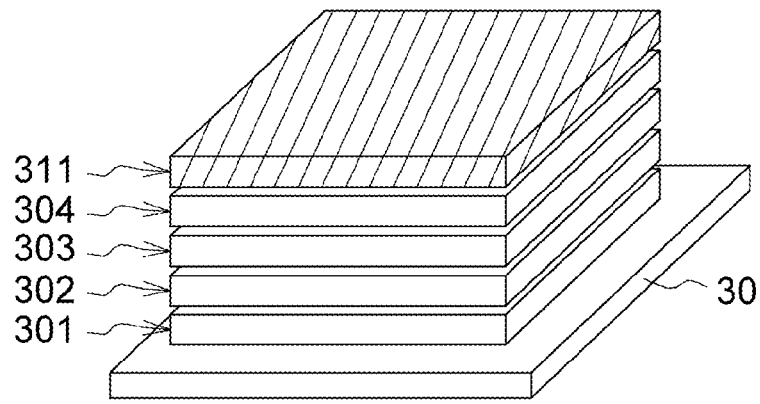
FIG. 3 illustrates a structure of ECC spare bits in 3D memory according to the first embodiment of the disclosure.

FIG. 3 illustrates a structure of ECC spare bits in 3D memory according to the first embodiment of the disclosure. In this embodiment, a structure of ECC spare bits in 3D memory 3 is provided. As shown in FIG. 3, the structural design of 3D memory 3 has four stacking memory layers 301, 302, 303 and 304, and one extra layer 311 designed for storing ECC spare bits on the substrate 30. In the example of constructing an extra layer 311 for ECC spare bits, it is estimated that the extra cost is merely 3% in increase, but can get 25% extra spare bits for ECC or repair bits. These extra bits can provide 120 bits/KByte ECC and/or serves as the repair bits for use.

Figure 4:
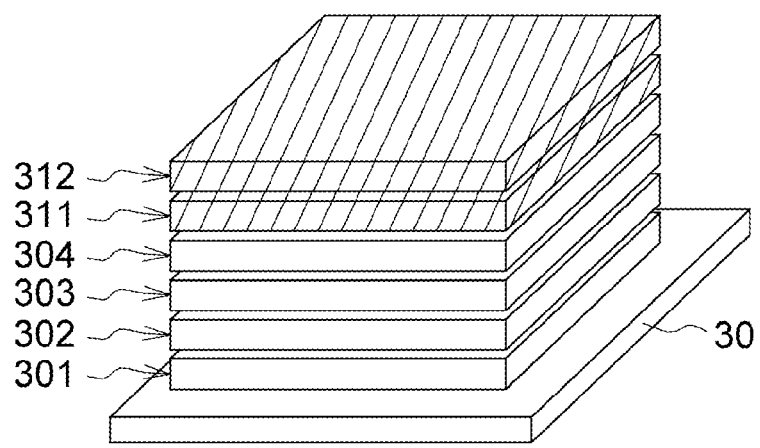
FIG. 4 illustrates another structure of ECC spare bits in 3D memory according to the first embodiment of the disclosure.

FIG. 4 illustrates another structure of ECC spare bits in 3D memory according to the first embodiment of the disclosure. As shown in FIG. 4, the structural design of 3D memory 4 has four stacking memory layers 301, 302, 303 and 304, and two extra layers 311 and 312 for ECC spare bits on the substrate 30. By constructing two extra layers 311 and 312 for ECC spare bits, more error bits can be corrected/repaired and the achievement on process can be very promising.

Figure 5A:
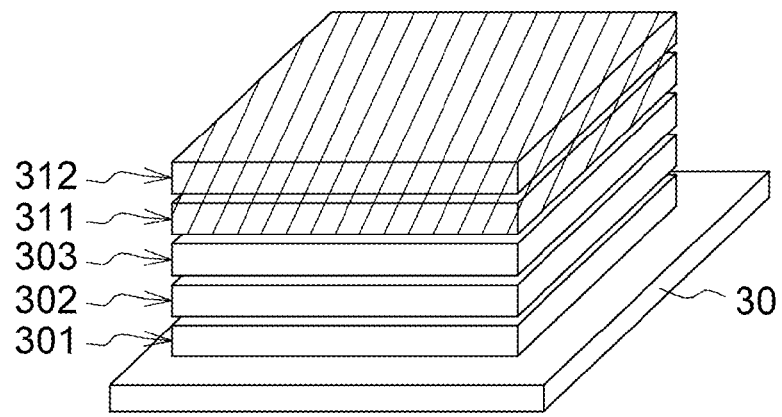
FIG. 5A illustrates another structure of ECC spare bits in 3D memory according to the first embodiment of the disclosure having three stacking memory layers.
Figure 5B:
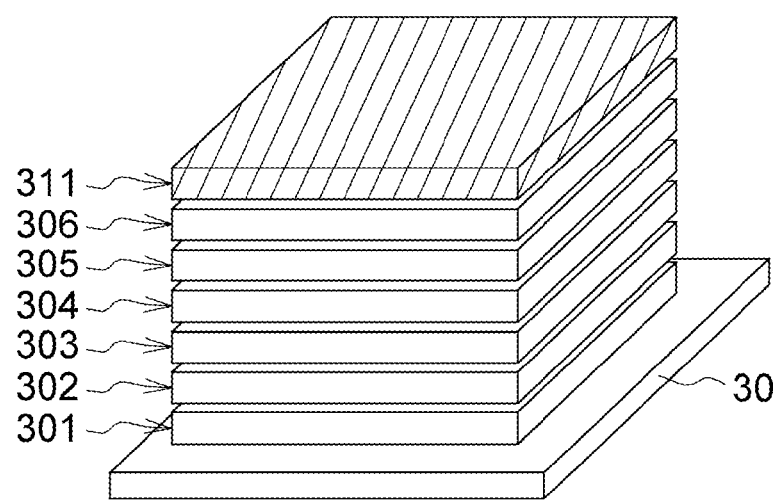
FIG. 5B illustrates another structure of ECC spare bits in 3D memory according to the first embodiment of the disclosure having six stacking memory layers.

The structural design of 3D memory according to the embodiments of the disclosure is applicable to the 3D memory with $2^N$ stacking memory layers; for examples, $2^2$ stacking memory layers adopted in the structure of FIG. 3 and FIG. 4. However, it is noted that the structural design of 3D memory according to the embodiments of the disclosure is applicable to the 3D memory with non-$2^N$ stacking memory layers. FIG. 5A illustrates another structure of ECC spare bits in 3D memory 5 according to the first embodiment of the disclosure, which has three stacking memory layers 301~303 (non-$2^N$ stacking memory layers) and two extra layers 311 and 312 for ECC spare bits; while FIG. 5B illustrates another structure of ECC spare bits in 3D memory 5' according to the first embodiment of the disclosure, which has six stacking memory layers 301~306 (non-$2^N$ stacking memory layers) and one extra layer 311 for ECC spare bits.

Figure 6:
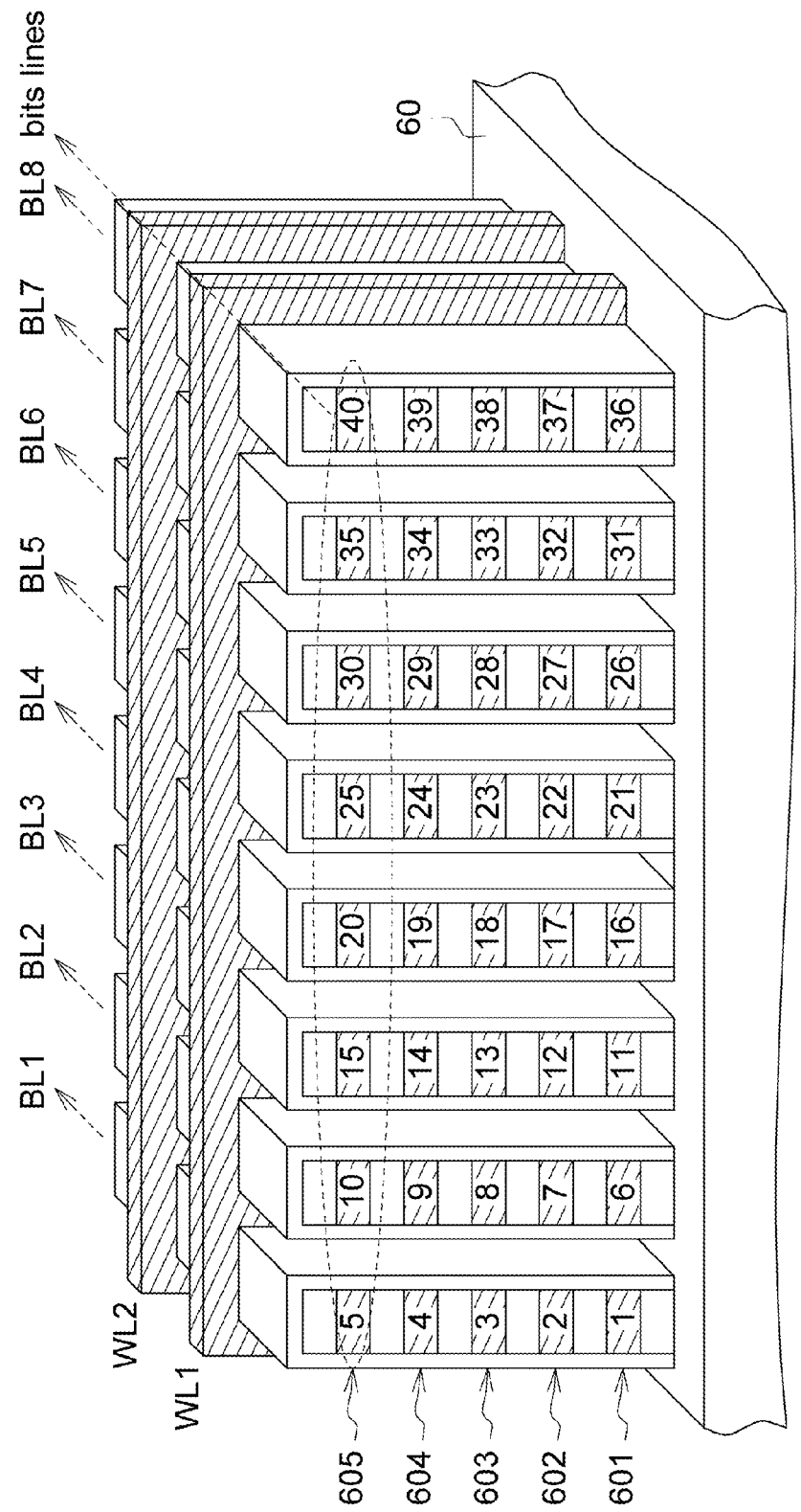
FIG. 6 illustrates a VG structure of ECC spare bits in 3D memory according to the first embodiment of the disclosure.

In order to use the spare bits constructed in the same layer for performing the ECC and repair function, data in the different layers have to be read out at the same time. The embodiments of the present disclosure can be implemented, but not limited, by a vertical-gate (VG) structure or a finger VG structure. FIG. 6 illustrates a VG structure of ECC spare bits in 3D memory according to the first embodiment of the disclosure. The structure of FIG. 6 has 40 cells, including separated spare bits for ECC dispersed in the same physical layer while the non-ECC bits are in different layers.

In FIG. 6, the structure of 3D memory 6 comprises a substrate 60, a plurality of horizontal layers (ex: 601~605) with plural sets of bit lines (ex: BL1, BL2, BL3, BL4, BL5, BL6, BL7 and BL8), a plurality of word lines (ex: WL1, and WL2, and made of polysilicon), m of cells for storing information data and n of cells for storing ECC spare bits. In an embodiment, each set of the bit lines comprise several bit lines (ex, the potions denoted as 16~20 of the set BL4) made of polysilicon, and the bit lines are interposed by oxides, wherein the bit lines and oxides are enclosed by the charge chapping layer such as an ONO multilayer, an ONONO multilayer, or BE-SONOS multilayer (please referred to U.S. Pat. No. 7,414,889 for the structure of BE-SONOS multilayer).

The horizontal layers 601~605 are arranged in a three-dimensional array and disposed in parallel to the substrate 60. The sets of bit lines BL1~BL8 in each horizontal layer are disposed in parallel to each other. The word lines WL1, and WL2 are disposed vertically to the substrate 60 and vertically to the sets of bit lines BL1~BL8. Also, m of cells for storing information data and n of cells for storing ECC spare bits are read out at the same time for performing the ECC and repair function in the embodiment of the disclosure. As shown in FIG. 6, 40 cells are taken for illustration, and 32 (m) cells are used for storing information data (ex: numbers 1-4, 6-9, 11-14, 16-19, 21-24, 26-29, 31-34 and 36-39), and 8 (n) cells are used for storing ECC spare bits. The cells of FIG. 6 designated as number 5, number 10, number 15, number 20, number 25, number 30, number 35 and number 40 are used for storing ECC spare bits and positioned in the same horizontal layer; for example, the horizontal layer 605. Also, the horizontal layer with the cells for storing ECC spare bits could be, boy not limited to, the top layer of the horizontal layers as shown in FIG. 6.

To use the spare bits for performing the ECC and repair function, data in the different layers have to be read out at the same time. In an embodiment, m of cells for storing information data and n of cells for storing ECC spare bits could be electrically connected to a control circuit, such as an ECC circuit (not shown in FIG. 6) for receiving and analyzing the output data, and correcting the error bits subsequently.

Second Embodiment

The first embodiment illustrates the ECC spare bits in the 3D memory of the present disclosure are constructed at the same one or more extra layers. However, the disclosure is not limited thereto. The second embodiment demonstrates that the ECC spare bits in the 3D memory are constructed at the different physical layers. Similarly, the second embodiment of the present disclosure is implemented, but not limited, by a vertical-gate (VG) structure for illustration.

Figure 7:
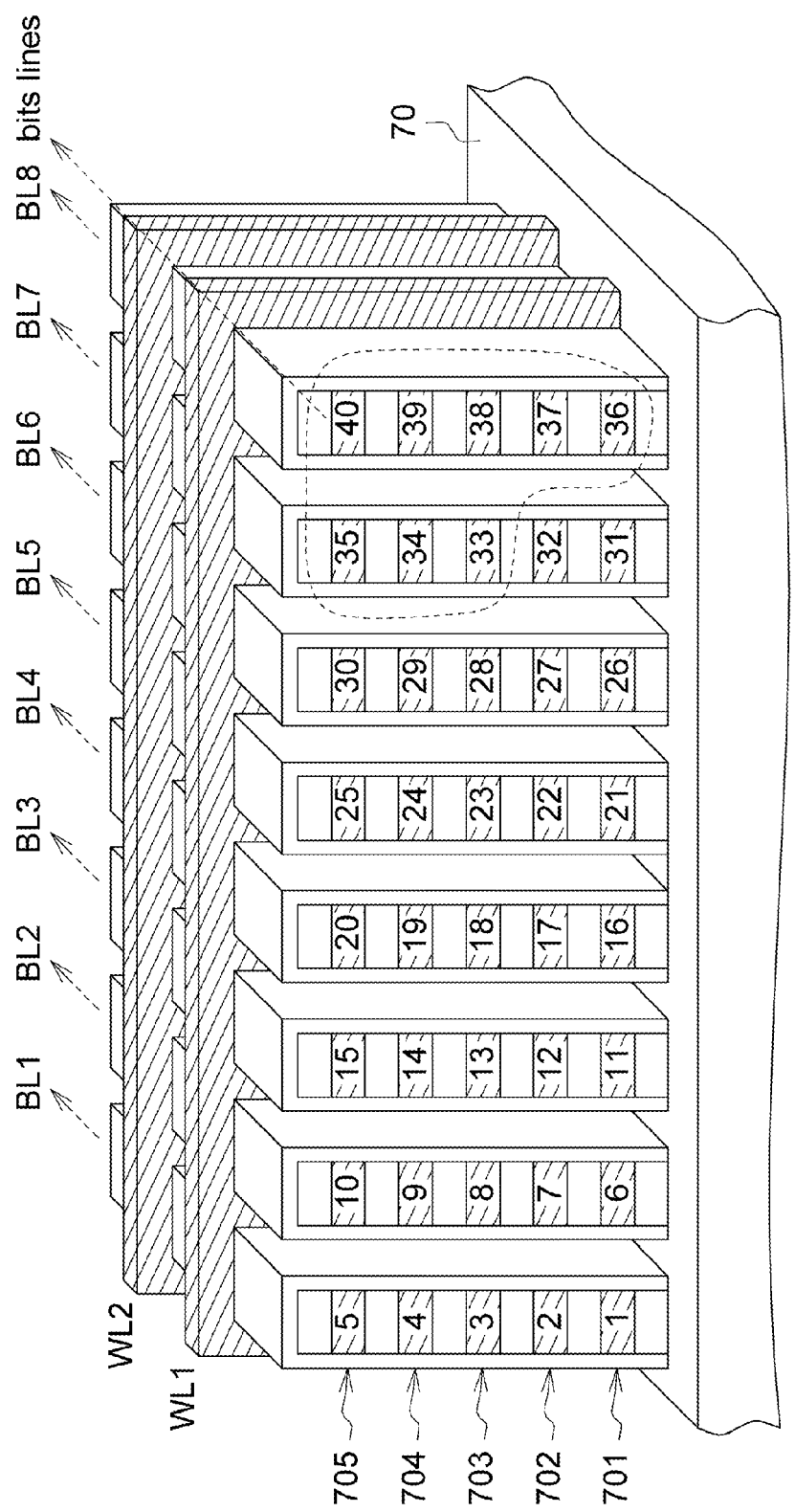
FIG. 7 illustrates a VG structure of ECC spare bits in 3D memory according to the second embodiment of the disclosure.

FIG. 7 illustrates a VG structure of ECC spare bits in 3D memory according to the second embodiment of the disclosure.

Similar to FIG. 6, the structure of 3D memory 7 of FIG. 7 comprises a substrate 70, a plurality of horizontal layers 701~705 having plural sets of bit lines BL1~BL8 (ex: made of polysilicon), a plurality of word lines WL1 and WL2 (ex: made of polysilicon), m of cells for storing information data and n of cells for storing ECC spare bits. The horizontal layers 701~705 are arranged in a three-dimensional array and disposed in parallel to the substrate 70. The sets of bit lines in each horizontal layer are disposed in parallel to each other. Each set of the bit lines comprise several bit lines (ex, the potions denoted as 16~20 of the set BL4), and the bit lines are separated by interposing by oxides, wherein the bit lines and oxides are enclosed by the charge chapping layer such as an ONO layer. The word lines WL1 and WL2 are disposed vertically to the substrate 70 and vertically to the sets of bit lines BL1~BL8. Also, m of cells for storing information data and n of cells for storing ECC spare bits are read out at the same time for performing the ECC and repair function in the embodiment of the disclosure. As shown in FIG. 7, 40 cells are taken for illustration, and 32 (m) cells are used for storing information data (numbers 1-32), and 8 (n) cells are used for storing ECC spare bits (numbers 33-40). The cells of FIG. 7 designated as number 33-40 are used for storing ECC spare bits and positioned in the different horizontal/physical layers (i.e. the cells 33~40 positioned in the horizontal layers 701~705 respectively). Furthermore, the cells (numbers 33~40) shown in FIG. 7 positioned in the different horizontal layers for storing ECC spare bits are aligned as two columns vertical to the substrate 70. However, it is also applicable that the cells for storing ECC spare bits are dispersed in different areas and not necessary to be aligned as one or more columns vertical to the substrate 70.

Figure 8:
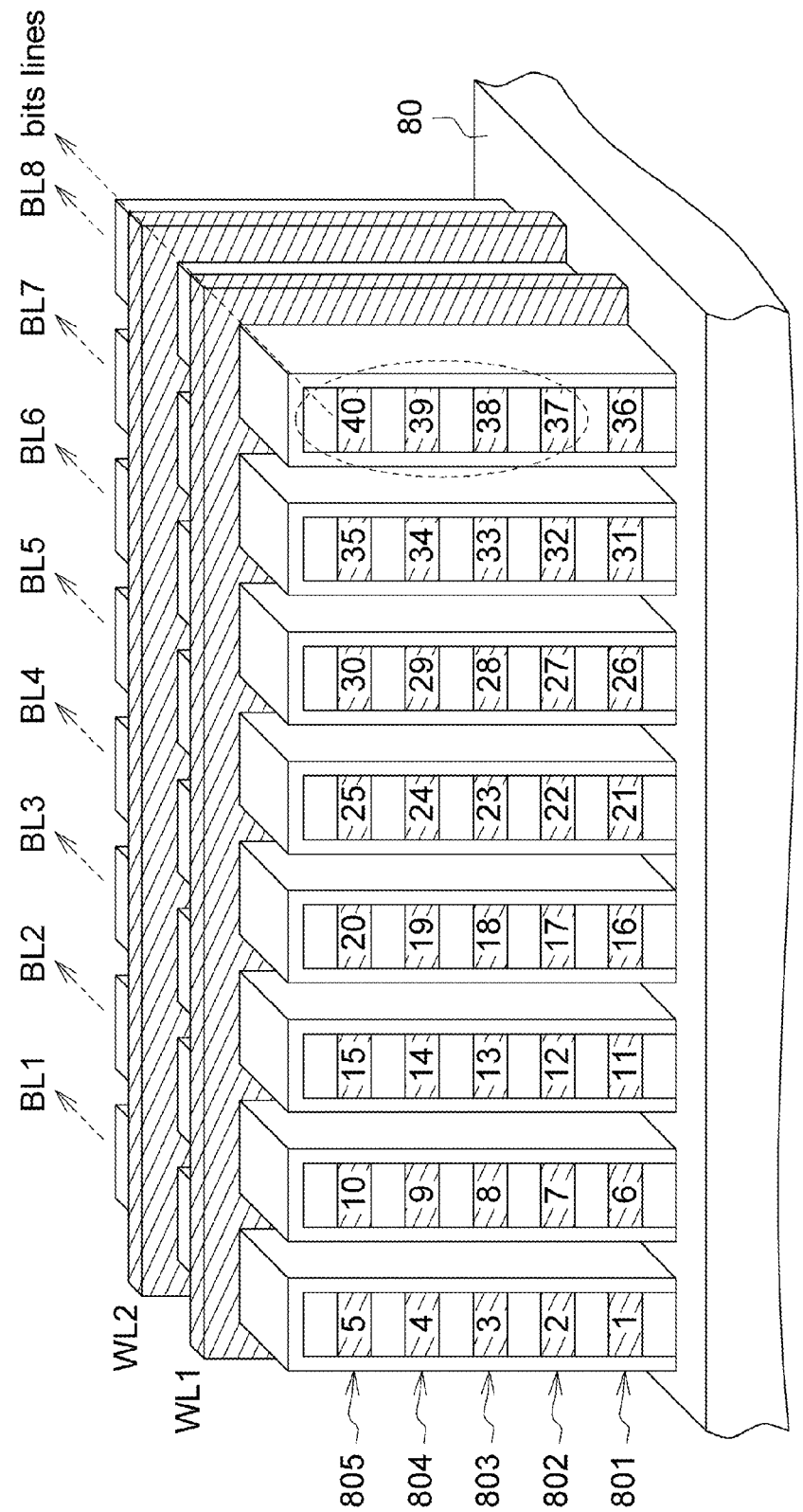
FIG. 8 illustrates another VG structure of ECC spare bits in 3D memory according to the second embodiment of the disclosure.

FIG. 8 illustrates another VG structure of ECC spare bits in 3D memory according to the second embodiment of the disclosure. The structure of FIG. 8 is very similar to the structure of FIG. 7, and 40 cells having separated spare bits for ECC dispersed in several areas are taken for illustration in FIG. 8.

In FIG. 8, the structure of 3D memory 8 also comprises a substrate 80, a plurality of horizontal layers 801~805 having plural sets of bit lines BL1~BL8 (ex: made of polysilicon), a plurality of word lines WL1 and WL2 (ex: made of polysilicon), m of cells for storing information data and n of cells for storing ECC spare bits. The horizontal layers 801~805 are arranged in a three-dimensional array and disposed in parallel to the substrate 80. Similarly, each set of the bit lines comprise several bit lines (ex, the potions denoted as 16~20 of the set BL4), and the bit lines are separated by interposing by oxides, wherein the bit lines and oxides are enclosed by the charge chapping layer such as an ONO layer. The sets of bit lines in each horizontal layer are disposed in parallel to each other. The word lines WL1 and WL2 are disposed vertically to the substrate 80 and vertically to the sets of bit lines BL1~BL8. Also, m of cells for storing information data and n of cells for storing ECC spare bits are read out at the same time for performing the ECC and repair function in the embodiment of the disclosure. As shown in FIG. 8, 40 cells are taken for illustration, and 32 (m) cells (i.e. numbers 1-16 and 21-36) are used for storing information data, and 8 (n) cells are used for storing ECC spare bits. The cells of FIG. 8 designated as number 17~number 20 and number 37~number 40 are used for storing ECC spare bits. Similar to the structure of FIG. 7, the cells of FIG. 8 denoted as number 17~number 20 are positioned in the different horizontal/physical layers (i.e. the cells 17~20 positioned in the horizontal layers 802~805 respectively) and aligned as one column vertical to the substrate 80. The cells of number 37~number 40 are positioned in the different horizontal/physical layers and aligned as another column vertical to the substrate 80. However, it is also applicable that the cells for storing ECC spare bits are dispersed in different areas and not necessary to be aligned as a column vertical to the substrate 80.

To use the spare bits constructed in the different layers for performing the ECC and repair function, data in the different layers have to be read out at the same time. In an embodiment, m of cells for storing information data and n of cells for storing ECC spare bits could be electrically connected to a control circuit, such as an ECC circuit (not shown in FIG. 7~FIG. 8) for receiving and analyzing the output data, and correcting the error bits subsequently.

Third Embodiment

Figure 9:
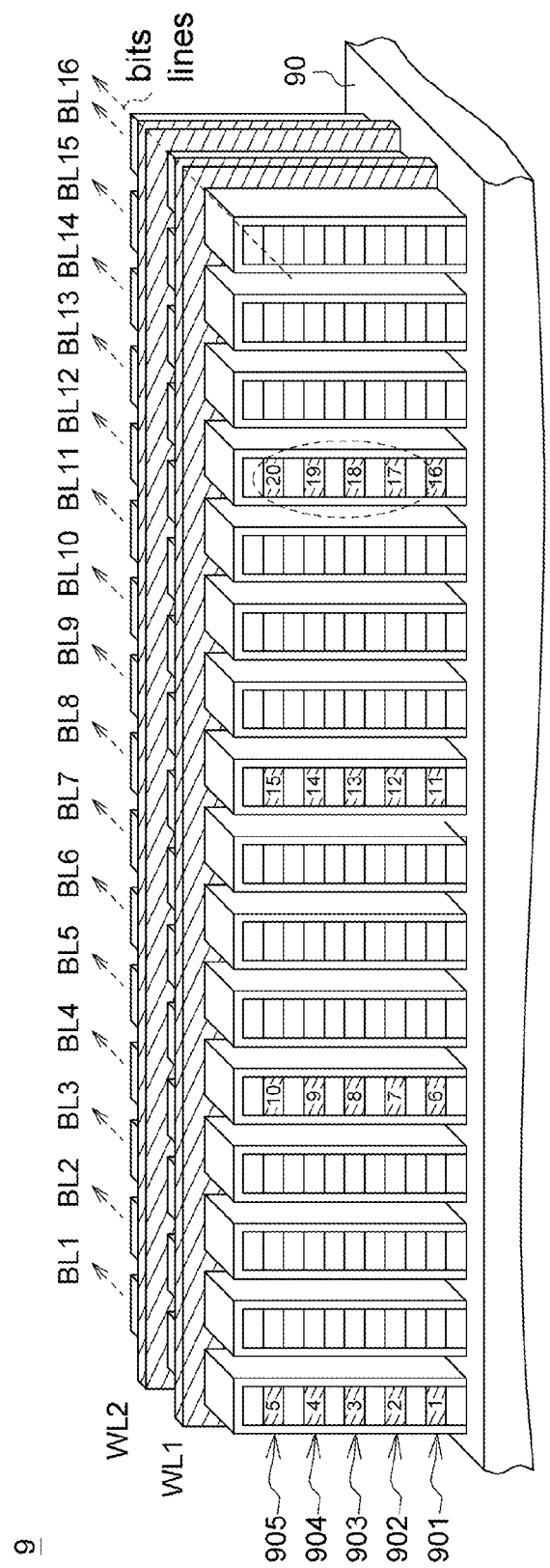
FIG. 9 illustrates a VG structure of ECC spare bits in 3D memory according to the third embodiment of the disclosure.

The structures of ECC spare bits in 3D memory according to the aforementioned embodiments can be slightly modified for performing ECC function. FIG. 9 illustrates a VG structure of ECC spare bits in 3D memory according to the third embodiment of the disclosure. Similar to the structures in the above embodiments, the data have to be read out at the same time for performing the ECC correction and repair function (electrically, the data are in the same page). However, the ECC spare bits may be separated physically in some of the structure (ex: VG structure or Finger VG structure).

In FIG. 9, the structure of 3D memory 9 also comprises a substrate 90, a plurality of horizontal layers 901~905 having plural sets of bit lines BL1~BL16, a plurality of word lines WL1~WL2, m of cells for storing information data and n of cells for storing ECC spare bits. The horizontal layers 901~905 are arranged in a three-dimensional array and disposed in parallel to the substrate 90. The sets of bit lines in each horizontal layer are disposed in parallel to each other. The word lines WL1~WL2 are disposed vertically to the substrate 90 and vertically to the sets of bit lines BL1~BL16. Other details of the structure of FIG. 9 can be referred to the first and second embodiments. As shown in FIG. 9, physical separated data in the structure of 3D memory 9 can be read at the same time, and the stored data are continually arranged in the vertical direction to the substrate 90, but not continually arranged in the BL direction. 20 cells are taken for illustration, and 16 (m) cells are used for storing information data (numbers 1-16), and 4 (n) cells are used for storing ECC spare bits (numbers 17-20). The cells of FIG. 9 designated as numbers 1~5 positioned at the set of bit lines BL1, numbers 6~10 positioned at the set of bit lines BL5, numbers 11~15 positioned at the set of bit lines BL9, numbers 16~20 positioned at the set of bit lines BL13, are respectively arranged in the direction vertical to the substrate 90. In this embodiment, m of cells for storing information data and n of cells for storing ECC spare bits could be read out at the same time for performing the ECC and repair function.

Fourth Embodiment

The structures of ECC spare bits in 3D memory according to the aforementioned embodiments can be slightly modified for the application as "RAID" (Redundant Array of Independent Disks) design. RAID is a technology that provides increased storage functions and reliability through redundancy. This is achieved by combining multiple disk drive components into a logical unit, where data is distributed across the drives in one of several ways called "RAID levels". RAID is now used as an umbrella term for computer data storage schemes that can divide and replicate data among multiple disk drives. The schemes or architectures are named by the word RAID followed by a number (e.g., RAID 0, RAID 1). "RAID 0" (block-level striping without parity or mirroring) design has no (or zero) redundancy. It provides improved performance and additional storage but no fault tolerance. Hence simple stripe sets are normally referred to as RAID 0. A single disk failure destroys the entire array because when data is written to a RAID 0 volume, the data is broken into fragments called blocks. Any disk failure destroys the array. In "RAID 1" (mirroring without parity or striping) design, data is written identically to multiple disks (a "mirrored set"). Although many implementations create sets of 2 disks, sets may contain 3 or more disks. Array provides fault tolerance from disk errors or failures and continues to operate as long as at least one drive in the mirrored set is functioning. Thus, "RAID 0" design is good for performance, and "RAID 1" design is good for reliability. The various designs of RAID systems involve two key goals: increase data reliability and increase input/output performance. When multiple physical disks are set up to use RAID technology, this is called in a RAID array, and this RAID array distributes data across multiple disks, but the array is addressed by the operating system as one single disk.

Figure 10A:
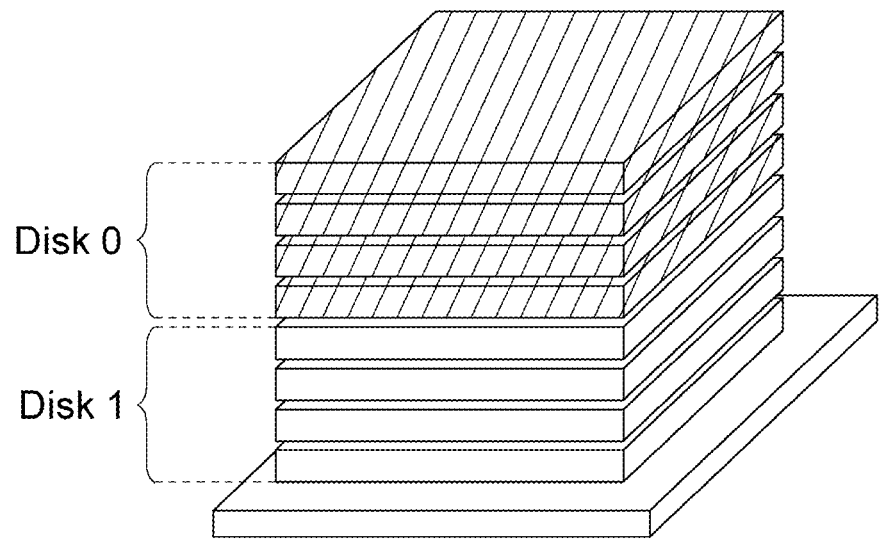
FIG. 10A simply illustrates a structure of 3D memory in the application of "RAID 1" design according to the fourth embodiment of the disclosure.
Figure 10B:
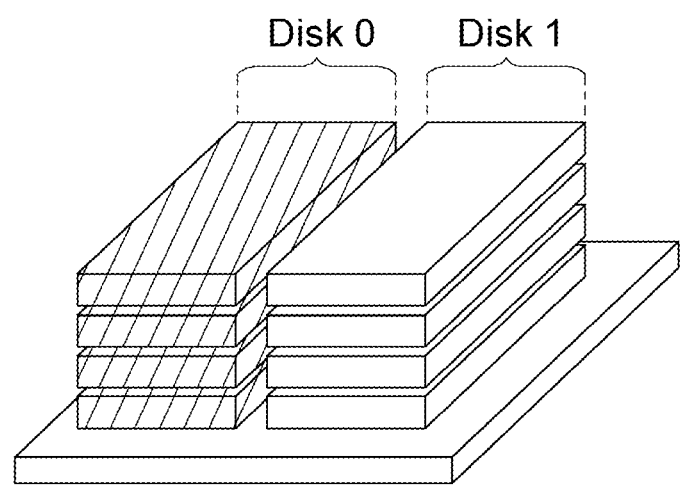
FIG. 10B simply illustrates another structure of 3D memory in the application of "RAID 1" design according to the fourth embodiment of the disclosure.

FIG. 10A simply illustrates a structure of 3D memory in the application of "RAID 1" design according to the fourth embodiment of the disclosure. FIG. 10B simply illustrates another structure of 3D memory in the application of "RAID 1" design according to the fourth embodiment of the disclosure. As shown in RAID 1 design of FIG. 10A, the information data stored in the bottom four stacking memory layers can be referred to "DISK 1", while the duplicated information data stored in the top four stacking layers (a "mirrored set") can be referred to "DISK 0" to increase the reliability of the hard drive system. Similarly, RAID 1 design of FIG. 10B simply shows that the information data stored in four stacking memory layers on the right hand side is referred to "DISK 1", while the duplicated information data stored in another four stacking memory layers on the left hand side (a "mirrored set") is referred to "DISK 0" to increase the reliability of the hard drive system.

According to the aforementioned descriptions, enhancement of ECC and/or repair capability of the structures of ECC spare bits in 3D memory in the embodiments without extra array area penalty can be achieved, so is the reliability of 3D memory. The 3D memory has two groups of cells including m of cells for storing information data and n of cells for storing ECC spare bits (n and m are positive integers, and n<m), and (m+n) of cells can be read out at the same time for performing the ECC (Error Checking and correcting) and repair function. Also, the ECC spare bits in the 3D memory according to the present disclosure can be constructed at one or more extra layers (i.e. in the same physical layer/plane), or can be constructed at the different physical layers. The embodiments of the present disclosure can be widely used in many applications, such as in NAND chip, SSD and storage system.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A structure of three-dimensional (3D) memory, comprising:
   a plurality of stacking layers arranged in a memory array area of the structure of 3D memory as a three-dimensional array, and the stacking layers disposed parallel to each other on a substrate, and the stacking layers comprising a plurality of stacking memory layers; and
   a plurality of cells comprising a first group of cells for storing information data and a second group of cells for storing ECC (error checking and correcting) spare bits positioned within the memory array area, and the first group of cells being positioned at the stacking memory layers, and all of the first group and the second group of cells being read out at the same time for performing an ECC function, wherein the second group of cells are at least formed in three different stacking layers, and the second group of cells are aligned vertically to the substrate to form at least two columns all parallel to each other and positioned within the memory array area, and said two columns of the second group of cells arranged in parallel are separated from each other by at least one column of the first group of cells.

2. The structure according to claim 1, wherein the second group of cells for storing ECC spare bits are positioned at a top of the stacking layers.

3. The structure according to claim 1, wherein the second group of cells arranged in parallel for storing ECC spare bits are separately positioned at three or more stacking layers.

4. The structure according to claim 1, wherein the first group of cells for storing information data are positioned at the stacking memory layers contiguously in vertical columns perpendicular to the substrate.

5. The structure according to claim 1, wherein the second group of cells for storing ECC spare bits are positioned at different stacking layers.

6. The structure according to claim 5, wherein the second group of cells positioned in the different stacking layers are aligned as three or more columns vertical to the substrate and said columns are all arranged in parallel.

7. The structure according to claim 1, wherein the first group of cells for storing information data and the second group of cells for storing ECC spare bits being read out at the same time are electrically connected to an ECC circuit for performing the ECC function.

8. The structure according to claim 1 being a vertical-gate (VG) type of 3D memory structure, or a finger VG type of 3D memory structure.

9. A structure of three-dimensional (3D) memory, comprising:
   a substrate;
   a plurality of horizontal layers in parallel to the substrate and arranged in a memory array area of the structure of 3D memory as a three-dimensional array, and each horizontal layer comprising plural sets of bit lines disposed in parallel to each other;
   a plurality of word lines disposed vertically to the substrate and the sets of bit lines; and
   m of cells for storing information data and n of cells for storing ECC spare bits positioned within the memory array area, n and m being positive integers, and n<m, wherein said n of cells for storing ECC spare bits are at least formed in three different horizontal layers, and said n of cells for storing ECC spare bits are aligned vertically to the substrate to form at least two columns all parallel to each other and positioned within the memory array area, and said two columns of said n of cells for storing ECC spare bits arranged in parallel are separated from each other by at least one column of said m of cells for storing information data;
   wherein m of cells and n of cells are read out at the same time.

10. The structure according to claim 9, wherein n of cells for storing ECC spare bits are positioned at a top layer of the horizontal layers.

11. The structure according to claim 9, wherein n of cells for storing ECC spare bits are respectively positioned at three or more horizontal layers.

12. The structure according to claim 9, wherein m of cells for storing information data are positioned at the horizontal layers contiguously in vertical columns perpendicular to the substrate.

13. The structure according to claim 9, wherein n of cells for storing ECC spare bits are positioned in the different horizontal layers.

14. The structure according to claim 13, wherein n of cells positioned in the different horizontal layers are aligned as two or more columns vertical to the substrate and all paralleled to each other.

15. The structure according to claim 9, wherein m of cells for storing information data and n of cells for storing ECC spare bits capable of being read out at the same time are electrically connected to an ECC circuit.

* * * * *